(12) United States Patent
Liu et al.

(10) Patent No.: US 6,819,579 B1
(45) Date of Patent: Nov. 16, 2004

(54) INTEGRATED CONTENT ADDRESSABLE MEMORY ARCHITECTURE

(75) Inventors: Kwo-Jen Liu, San Jose, CA (US); Hsin-Shih Wang, Fremont, CA (US)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 10/249,588

(22) Filed: Apr. 22, 2003

(51) Int. Cl.[7] .............................................. G11C 15/00

(52) U.S. Cl. ........................................ 365/49; 365/190

(58) Field of Search ........................... 365/49, 190, 120

(56) References Cited

U.S. PATENT DOCUMENTS 5,999,435 A * 12/1999 Henderson et al. ........... 365/49

* cited by examiner

*Primary Examiner*—M. Tran
(74) *Attorney, Agent, or Firm*—Winston Hsu (57) ABSTRACT

A novel ten-transistor (10-T) content addressable memory (CAM) cell and an integrated CAM architecture. A six-transistor (6-T) static random access memory (SRAM), cell and a four-transistor (4-T) comparator module of the 10-T CAM cell are respectively coupled to different bit lines for preventing any disturbance at a match line associated with the 10-T CAM. Each row of the integrated CAM architecture includes a valid bit cell combined with a protect bit cell and at least a mask cell with global resetting function to sufficiently ensure the correction and flexibility during comparing operations.

24 Claims, 11 Drawing Sheets

INTEGRATED CONTENT ADDRESSABLE MEMORY ARCHITECTURE

BACKGROUND OF INVENTION

1. Field of the Invention

The invention relates to an integrated content addressable memory (CAM) architecture, and more particularly, to an integrated CAM architecture based on a plurality of novel ten-transistor (10-T) CAM cells combined with a valid bit cell, a protect bit cell, and at least a mask cell coupled to a plurality of associated 10-T CAM cells.

2. Description of the Prior Art

Most memory devices store and retrieve data by addressing specific memory locations. As a result, this path often becomes the limiting factor for systems that rely on fast memory accesses. The time required to find an item stored in memory can be reduced significantly if the item can be identified for access by its content rather than by its address. A memory that is accessed in this way is called content-addressable memory (CAM). Briefly speaking, the basic feature of the CAM can be treated as a standard storage system, as a random access memory (RAM) device, combined with a comparison apparatus. Therefore, the CAM is an outgrowth of RAM technology and provides a performance advantage over other memory search structures. The CAM can be used to accelerate any application requiring fast searches of database, lists, or patterns, such as in image, voice recognition, or computer and communication designs. The CAM is also ideally suited for several functions, including data process of the computer's central processing unit (CPU), Ethernet address lookup, data compression, search engines, pattern recognition for encryption/decryption and compression/decompression applications, and so on.

Figure 1:
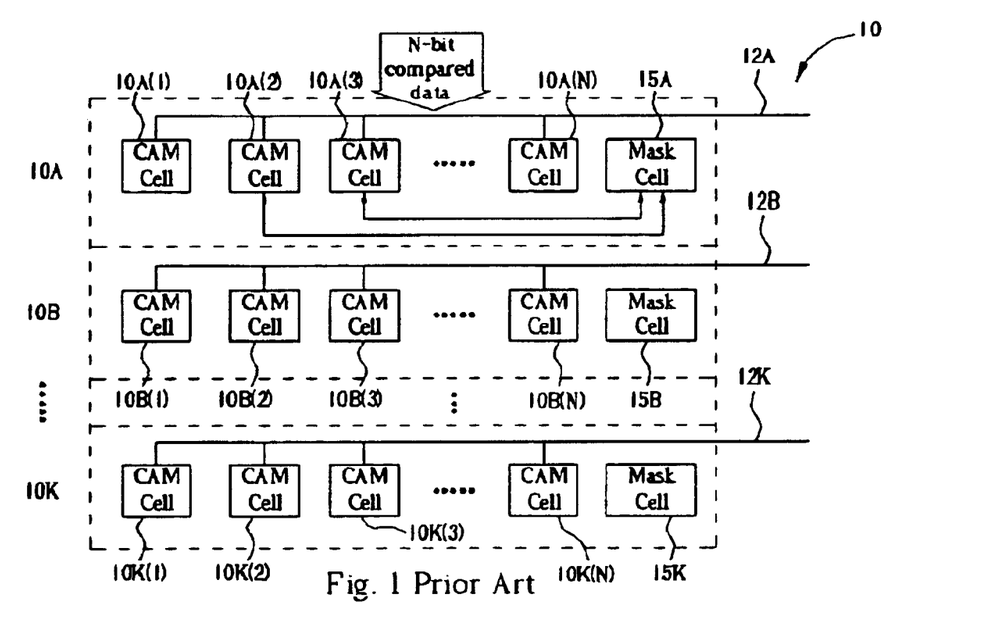
FIG. 1 is schematic diagram of a typical CAM architecture.

Conventional content addressable memory (CAM) cells have been implemented primarily with static random access memory (SRAM) cells and arranged in rows and columns. The SRAM-based CAM cells have received widespread use due to the high access speed of SRAM memory cells and the static nature of the cells. With the above-mentioned characteristics of the CAM, in addition to SRAM functions of writing and storing data, the CAM also searches and compares the stored data to determine if the data match a set of compared data (search data) applied to the memory. When the newly applied compared data (search data) match the data already stored in the memory, a match result is indicated, whereas if the search and stored data do not match, a mismatch result is indicated. Please refer to FIG. 1, which is schematic diagram of a typical CAM architecture 10 arranged with a plurality of rows 10A to 10K. As shown in FIG. 1, each row (10A to 10K) is coupled to a corresponding match line 12 (12A to 12K) for indicating whether the compared data match the data stored in the row. The compared data and the previously stored data are all N-bit digital data in the present embodiment. Take row 10A as instance, when the N-bit compared data are totally the same as the N-bit data stored in the row 10A of the CAM architecture 10, the corresponding match line outputs a logic high. On the contrary, when any data bit of the N-bit compared data is opposite to a corresponding data bit of the N-bit data stored in the row of the CAM architecture 10, the corresponding match line changes to output a logic low.

Please go on referring to FIG. 1. Previous approaches regarding data-comparing operation in a row of the CAM architecture 10 include a mask cell 15 (15A to 15K) being coupled to a plurality of associated CAM cells. The comparing operations of the associated CAM cells are then either enabled or disabled by the mask cell 15 (15A to 15K) content. For instance, the mask cell 15A in the row 10A are connected to the associated CAM cells 10A(2) and 10A(3), and the associated CAM cells 10A(2) and 10A (3) can be masked out by the mask cell 15A. Examples of such implementation are also illustrated in U.S. Pat. No. 6,154,384, "Ternary content addressable memory cell" issued to Nataraj et al. and U.S. Pat. No. 6,108,227, "Content addressable memory having binary and ternary modes of operation" issued to Voelkel. Usually the associated CAM cells will be masked out from the comparing operations when the mask cell is asserted, and not be masked out from the comparing operations when the mask cell is de-asserted.

Figure 2:
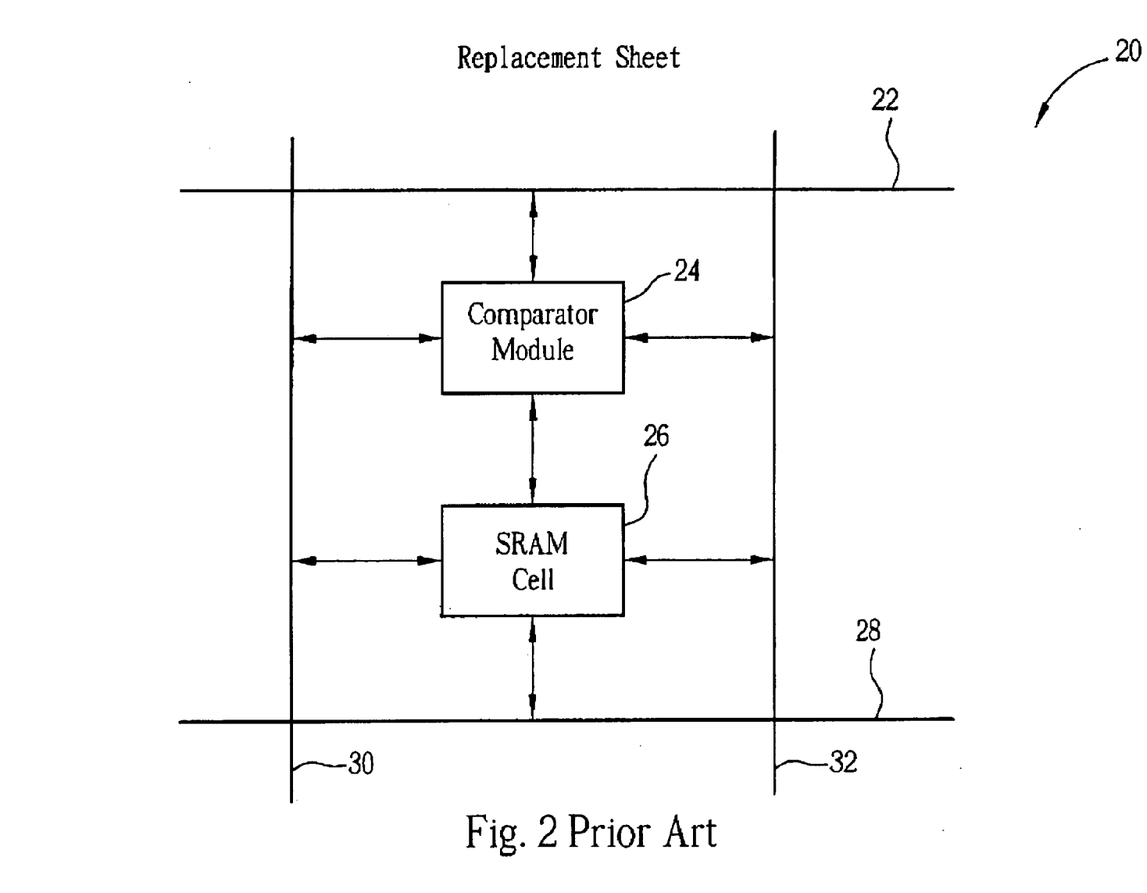
FIG. 2 is a schematic diagram of a prior-art CAM cell in a row of the CAM architecture as shown in FIG. 1.

Each row (10A to 10K) comprises a plurality of (binary) CAM cells. For instance, the row 10A comprises N CAM cells 10A(1) to 10A(N). Each CAM cell is able to store a digital data value having two states of information: a logic one state and a logic zero state. As shown in FIG. 1, the N-bit data stored in each row (10A to 10K) consist of N digital data value stored in corresponding N (binary) CAM cells. Please refer to FIG. 2, which is a schematic diagram of a (binary SRAM-based) prior-art CAM cell 20 in a row of the CAM architecture 10 as shown in FIG. 1. Taking the row 10A shown in FIG. 1 for instance, the CAM cell 20 as shown in FIG. 2 can correspond to each of the CAM cells 10A(1) to 10A(N) in the row 10A. The CAM cell 20 includes a SRAM cell 26, a comparator module 24, and a match line 22. The comparator module 24 compares the digital data value stored in the SRAM cell 26 with an input data value. When the input data value is the same as the digital data value stored in the SRAM cell 26, the match line 22 will stay at the pre-charged high level. When the input data value is opposite to the digital data value stored in the SRAM cell 26, the match line 22 will be pulled to a low potential. The CAM cell 20 further includes a word line 28, a first bit line 30, and a second bit line 32, wherein the SRAM cell 26 and the comparator module 24 both share the first and the second bit line 30, 32. Moreover, please refer to both FIG. 1 and FIG. 2, if the CAM cell 20 is in the row 10A and connected to the mask cell 15A as shown in FIG. 1, the CAM cell 20 becomes a mask-able CAM cell 20 that effectively store three states of information, namely: a logic one state, a logic zero state, and a don't care state for comparing operations. The design of mask-able CAM cells offer more flexibility for users to determine on a row-per-row (entry-per-entry) basis whose partial bits will be masked out during a comparing operation.

Figure 3:
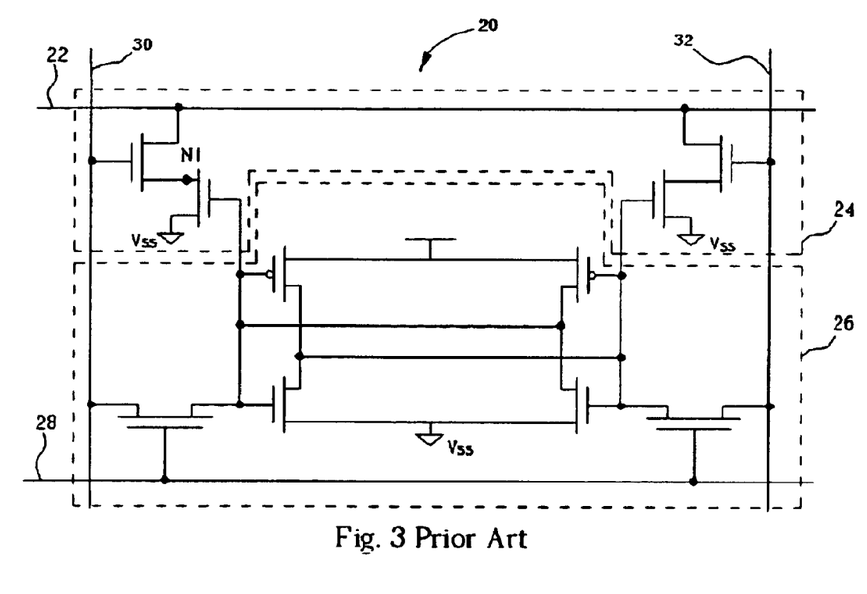
FIG. 3 is a schematic diagram of a detailed embodiment of the CAM cell as shown in FIG. 2 according to the prior art.

For detailing the prior-art embodiment as shown in FIG. 2, please refer to FIG. 3, which is a schematic diagram of a detailed embodiment of the CAM cell 20. The CAM cell 20 is a ten-transistor (10-T) CAM cell 20, which indicates that the SRAM cell 26 is a six-transistor (6-T) SRAM cell 26 and the comparator module 24 is a four-transistor (4-T) comparator module 24. During the practical implementation, the match line 22 will be pre-charged to a predetermined high potential before any comparison between the input data value and the digital data value stored in the 6-T SRAM cell 26. However, due to that the 6-T SRAM cell 26 and the 4-T comparator module 24 share the same first and the second bit line 30 and 32, the pre-charged potential of the match line 22 may be disturbed by the initial state of any other node in the 6-T SRAM cell 26 or the 4-T comparator module 24 as a node N1. In addition, the pre-charged potential of the match line 22 could be pulled down by the charge sharing between the match line 22 and the internal nodes as the node N1, and the voltage drop at the match line 22 depends on the capacitance related to the match line 22 and the internal nodes. All the above-mentioned effects of the prior art will be disadvantageous to the widely applied low-power operations.

In addition, for complying with the trend of integration of multiple functions in one electronic apparatus, it is desirable to keep CAM architecture as powerful as possible without increasing in each cell size that can translate into substantial increases in overall CAM architecture. Therefore, there is a need for developing a novel SRAM-based CAM cell and an integrated CAM architecture that achieve more efficient and sufficient alternatives, including better protection mechanism, larger comparing flexibility, and higher operating speed, than the prior art, while maintaining the characteristics of the SRAM-based CAM cell.

SUMMARY OF INVENTION

It is therefore a primary objective of the claimed invention to provide a ten-transistor (10-T) content addressable memory (CAM) cell and an integrated CAM architecture for preventing signal disturbance and for providing integral functions to solve the above-mentioned problems.

In the claimed invention, a novel ten-transistor (10-T) content addressable memory (CAM) cell and an integrated CAM architecture are proposed. During implementation, according to the design of 10-T CAM cell of the claimed invention, a pre-charged potential of a match line associated with the 10-T CAM cell will not be disturbed by the initial state of any other node in the 10-T CAM cell. In addition, we provide a valid bit cell and a protect bit cell with a global resetting function in each row (10A to 10K) of the integrated CAM architecture to sufficiently ensure the correction during comparing operations. Combined with the conventional masking operation, the integrated CAM architecture based on the 10-T CAM cells can provide integral and multiple functions to bring the characteristics of CAM into full play.

According to the claimed invention, a ten-transistor (10-T) content addressable memory (CAM) cell comprises a word line; a first bit line; a second bit line; a six-transistor (6-T) static random access memory (SRAM) cell coupled to the word line, the first bit line, and the second bit line for storing a digital data value; a match line for providing a match signal; a third bit line; a fourth bit line; and a four-transistor (4T) comparator module coupled to the match line, the third bit line, the fourth bit line, and the 6-T SRAM cell for comparing the digital data value stored in the 6-T SRAM cell with an input data value provided on the third bit line or the fourth bit line.

According to the claimed invention, an integrated content addressable memory (CAM) comprises a plurality of match lines for providing a plurality of corresponding match signals; and a plurality of rows 10A to 10K, each row coupled to a corresponding match line comprising a plurality of CAM cells coupled to the match line; a valid bit cell coupled to the match line for storing a valid bit indicating whether the row of the integrated CAM contains valid data; and a protect bit cell coupled to the valid bit cell for setting the valid bit to zero when the protect bit cell is de-asserted, and for setting the valid bit intact when the protect bit cell is asserted.

According to the claimed invention, an integrated content addressable memory (CAM) architecture comprises a plurality of match lines for providing a plurality of corresponding match signals; and a plurality of rows, each row coupled to a corresponding match line comprising a plurality of ten-transistor (10-T CAM cells coupled to the corresponding match line, each 10-T CAM cell comprising a word line; a first bit line; a second bit line, wherein the first bit line and the second bit line are a pair of complementary bit lines; a six-transistor (6-T) static random access memory (SRAM) cell coupled to the word line, the first bit line, and the second bit line for storing a digital data value; a first input line; a second input line, wherein the first input line and the second input line are a pair of complementary input lines; and a four-transistor (4-T) comparator module coupled to the match line, the first input line, the second input line, and the 6-T SRAM cell for comparing the digital data value stored in the 6-T SRAM cell with an input data value provided on the first input line or the second input line; a valid bit cell for storing a valid bit indicating whether data stored in the row of the integrated CAM architecture is valid, wherein the data stored in the row of the integrated CAM architecture are composed of the digital data values stored in the 6-T SRAM cells; a protect bit cell coupled to the valid bit cell for setting the valid bit to zero when the protect bit cell is de-asserted, and for setting the valid bit intact when the protect bit cell is asserted; and at least a mask cell coupled to a plurality of associated 10-T CAM cells for masking out the associated 10-T CAM cells when the mask cell is asserted and for not masking out the associated 10-T CAM cells when the mask cell is de-asserted.

These and other objectives of the present invention will no doubt become obvious to those of ordinary skill in the art after reading the following detailed description of the preferred embodiment, which is illustrated in the various figures and drawings.

DETAILED DESCRIPTION

Figure 4:
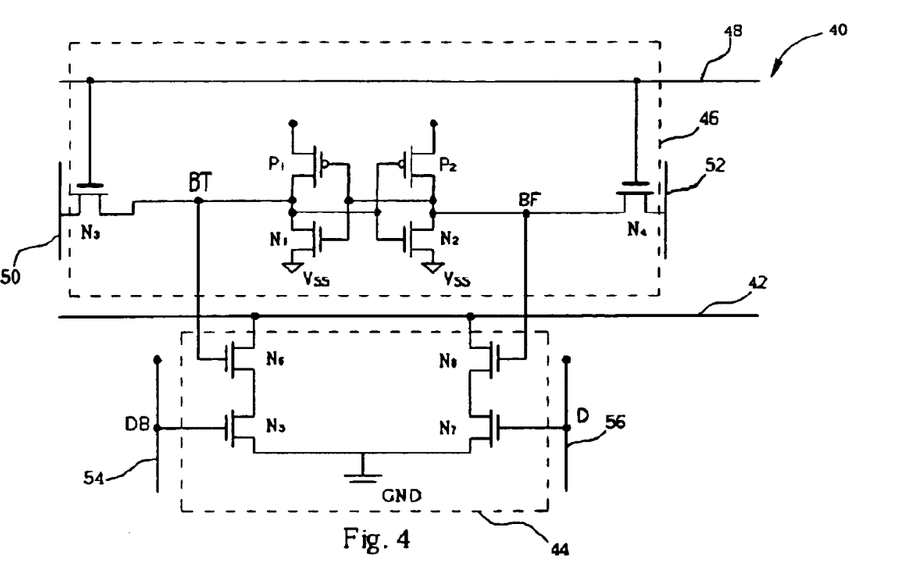
FIG. 4 is a schematic diagram of a ten-transistor (10-T CAM cell according to the present invention.

Please refer to FIG. 4, which is a schematic diagram of a ten-transistor (10-T) content addressable memory (CAM)

cell 40 according to the present invention. The 10-T CAM 40 includes a word line 48, a first bit line 50, a second bit line 52, and a six-transistor (6-T) static random access memory (SRAM) cell 46 coupled to the word line 48, the first bit line 50, and the second bit line 52 for storing a digital data value. The first bit line 50 and the second bit line 52 are a first pair of complementary bit lines. The 6-T SRAM cell 46 comprises two PMOS-type load transistors P1, P2 respectively functioning as a load element, two NMOS-type driver transistors N1, N2 respectively functioning as a driver, and two NMOS-type access transistors N3, N4 for data access in the 6-T SRAM cell 46. Taking a digital data value "1" storage as an example, during a data storage process, a higher voltage is inputted to the first bit line 50 and a lower voltage is inputted to the second bit line 52. Therefore, the load transistor P1 and the driver transistor N2 are turned on, and the load transistor P2 and the driver transistor N1 are turned off. Therefore, a portion of the current flow in node BF runs to a power supply terminal VSS via the turned-on driver transistor N2, but the current flow in the node BT will be rejected flowing to the power supply terminal VSS by the turned-off driver transistor N1. Consequently, node BT is in a higher voltage state and node BF is in a lower voltage state. Finally, the word line 48 is turned off so that the nodes BT, BF are maintained in the same states, and the digital data value will be stored at the nodes BT, BF respectively (the node BT and the node BF can be treated as a pair of complementary nodes).

The 10-T CAM 40 further includes a match line 42 for providing a match signal, a third bit line 54, a fourth bit line 56, and a four-transistor (4-T) comparator module. The third bit line 54 (with a node DB) and the fourth bit line 56 (with a node D) are a second pair of complementary bit lines. In the present embodiment, the 4-T comparator module 44, which forms an exclusive NOR (XNOR) circuit for executing comparing operations, comprises a first pair of NMOS-type transistors N5, N6, and a second pair of NMOS-type transistors N7, N8, and each pair of NMOS-type transistors is coupled between the match line 42 and a ground terminal GND. The 4-T comparator module 44 is coupled to the match line 42, the third bit line 54, the fourth bit line 56, and the ST SRAM cell 46 for comparing the digital data value stored in the 6-T SRAM cell 46 with an input data value provided on the third bit line 54 or the fourth bit line 56, and the match signal provided by the match line 42 indicates whether the digital data value stored in the 6-T SRAM cell 46 matches the input data value. Before any comparison between the input data value and the digital data value stored in the 6-T SRAM cell 46, the match line 42 will be initially pre-charged to a predetermined high potential Vcc. As shown in FIG. 4 when the comparing operation is implemented, if the input data value is the same as the digital data value stored in the 6-T SRAM cell 46, as the node BT and the node D are both determined to be in a low voltage state (BT=D=0), the match signal stays at the predetermined high potential Vcc. On the contrary, if the input data value is opposite to the digital data value stored in the 6-T SRAM cell 46, namely the voltage state of the node BT is not equal to the voltage state of the node D, the match signal will be pulled down form the predetermined high potential Vcc to a low potential.

Due to that the second pair of complementary bit lines (the third bit line 54 and the fourth bit line 56) coupled to 4-T comparator module 44 are separated from the first pair of complementary bit lines (the first bit line 50 and the second bit line 52) coupled to the 6-T SRAM cell 46, and the NMOS-type transistors N5 and N8 respectively associated with the third bit line 54 and the fourth bit line 56 are tied to the ground terminal GND, the pre-charged potential of the match line 42 then will not be disturbed by the initial state of any other node in the 6-T SRAM cell 46 or the 4-T comparator module 44. The voltage drop at the match line 42 and any possible false match signal can also be avoided in that regard. In addition, after software simulation identification, the separation of bit lines can decrease the bit-line loading of the 10-T CAM 40 to achieve a better high-speed performance.

Figure 5:
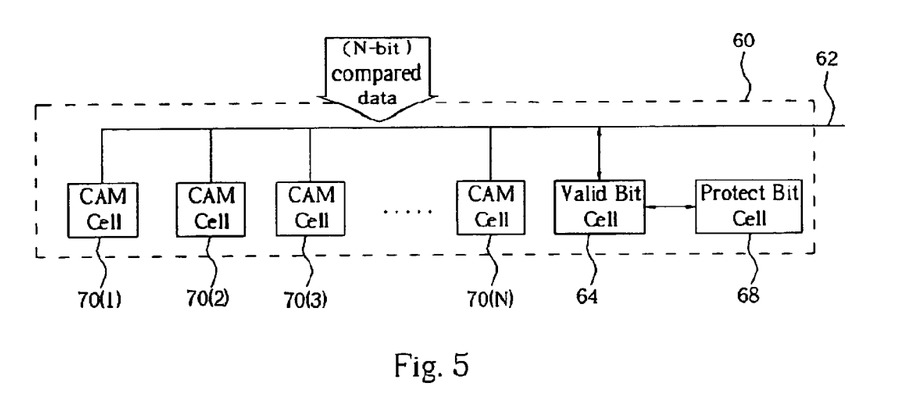
FIG. 5 is a schematic diagram of the first embodiment of an integrated CAM row according to the present invention.
Figure 6:
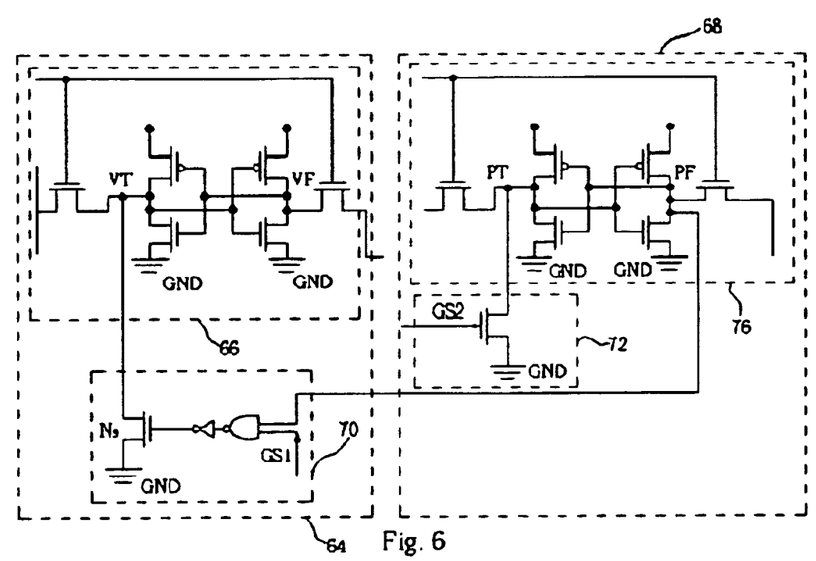
FIG. 6 is a schematic diagram of an embodiment of a valid bit cell combined with a protect bit cell according to the present invention, wherein the global valid reset signal (GS1) is active high.

Please refer to FIG. 5, which is a schematic diagram of the first embodiment of an integrated CAM row 60 according to the present invention. The integrated CAM row 60 includes a match line 62 for providing a corresponding match signal, a plurality of CAM cells 70 (70(1) to 70(N)), a valid bit cell 64, and a protect bit cell 68. Each CAM cell 70 as shown in FIG. 5 can be accomplished by a 10-T CAM 40 cell as shown in FIG. 4 or other type of CAM cell. If we apply the 10-T CAM 40 cell as shown in FIG. 4 into each CAM cell 70 as shown in FIG. 5, the integrated CAM row 60 as shown in FIG. 5 will inherit all the above-mentioned advantages of the novel 10-T CAM 40 cell of the present invention such as low bit-line loading and disturbance prevention. The main characteristic of the present invention is the installation of the valid bit cell 64 combined with the protect bit cell 68. The valid bit cell 64 is used for storing a valid bit for indicating whether the integrated CAM row 60 contains valid data, and the protect bit cell 68 is coupled to the valid bit cell 64 for setting the valid bit to zero when the protect bit cell 68 is de-asserted and for setting the valid bit intact when the protect bit cell 68 is asserted. In the integrated CAM row 60, when the valid bit is logic "0", the row is indicated to contain invalid data. Conversely, when the valid bit is logic "1", the row is indicated to contain valid data. Moreover, when the valid bit is logic "1", a comparing operation between compared data and data stored in the row of the integrated CAM is allowed to proceed. Similar to the prior art described in FIG. 1, the compared data and the previously stored data are both N-bit digital data in the present embodiment. The match signal of the match line 62 will be pre-charged to a predetermined high potential before the comparing operation. When the (N-bit) compared data are totally the same as the (N-bit) data stored in the integrated CAM row 60, the corresponding match signal stays at the predetermined high potential. When any data bit of the (N-bit) compared data is opposite to a corresponding data bit of the (N-bit) data stored in the integrated CAM row 60, the corresponding match signal changes to a low potential from the predetermined high level. Please refer to FIG. 6, which is a schematic diagram of an embodiment of the valid bit cell 64 combined with the protect bit cell 68 as shown in FIG. 5. The valid bit cell 64 is composed of a typical 6-T SRAM cell 66 (as shown in FIG. 3) and a valid-reset module 70 coupled to the protect bit cell 68. The protect bit cell 68 is also made of the 6-T SRAM cell 76 and a protect-reset input module 72 for receiving a global signal GS2, so that the protect bit cell 68 can be de-asserted by the global signal GS2. As shown in FIG. 5. A stored bit at a node PT of the protect bit cell 68 can be globally reset to logic "0" by applying a high potential global signal GS2 to the protect-reset input module 72. Similarly, the valid bit stored at a node VT of the valid bit cell 64 can be globally reset to logic "0' by applying a high-potential global signal GS1 to the valid-reset module 70 when the protect bit cell 68 is de-asserted (the stored bit at the node PT is to", and a stored bit at the node PF is "1"). If the protect bit cell 68 is stored with a "1") (the stored bit at the node PF is "0"), an NMOS-type transistor N9 of the valid-reset module 70 will be turned off and thus the valid bit cell 64 maintains its previous state after the global resetting. The above-mentioned double-protection design (by the valid bit cell 64 combined with the protect bit cell 68) and global resetting mechanism ensures sufficient error-avoidance and comparing flexibility.

Figure 7:
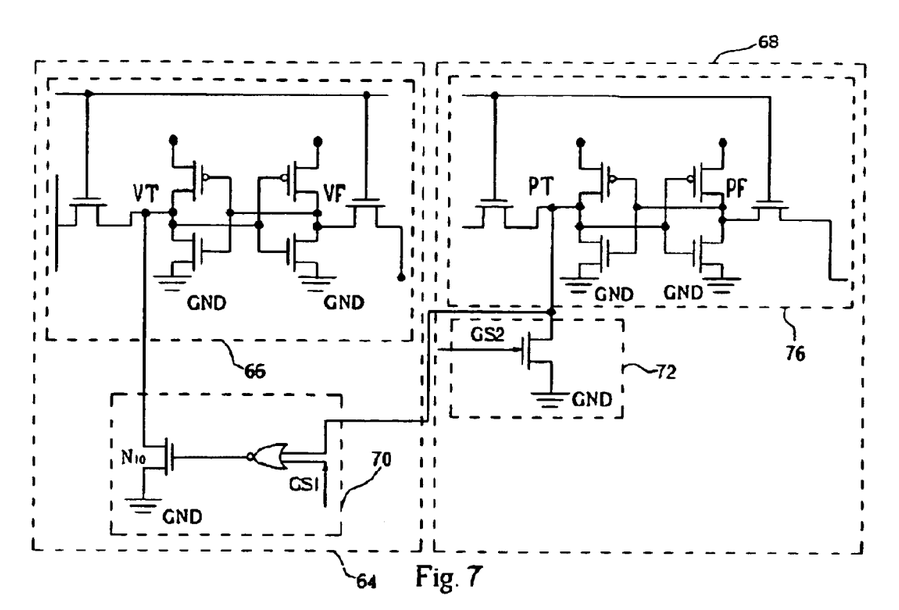
FIG. 7 is a schematic diagram of another embodiment of a valid bit cell combined with a protect bit cell according to the present invention, wherein the global valid reset signal (GS1) is active low.

Please refer to FIG. 7, which is a schematic diagram of another embodiment of the valid bit cell 64 combined with the protect bit cell 68 according to the present invention. All of the apparatuses shown in FIG. 7 with the same attached numbers as the embodiment shown in FIG. 6 execute exactly the same operations. The valid bit cell 64 is also composed of a 6-T SRAM cell 66 and a valid-reset module 70 coupled to the protect bit cell 68. The protect bit cell 68 is made of the 6-T SRAM cell 76 and a protect-reset input module 72 for receiving a global signal GS2, so that the protect bit cell 68 can be de-asserted by the global signal GS2 as the former embodiment shown in FIG. 6. According to the unique circuit design of the present embodiment, a stored bit at a node PT of the protect bit cell 68 can be globally reset to logic "0" by applying a high-potential global signal GS2 to the protect-reset input module 72, and the valid bit stored at a node VT of the valid bit cell 64 can also be globally reset to logic "0" by applying a low-potential global signal GS1 to the valid-reset module 70 when the protect bit cell 68 is de-asserted (the stored bit at the node PT is "0"). As the former embodiment shown in FIG. 6, if the protect bit cell 68 is stored with a logic "1" (the stored bit at the node PT is "1"), an NMOS-type transistor N10 of the valid-reset module 70 will be turned off and thus the valid bit cell 64 maintains its previous state after the global resetting.

Figure 8:
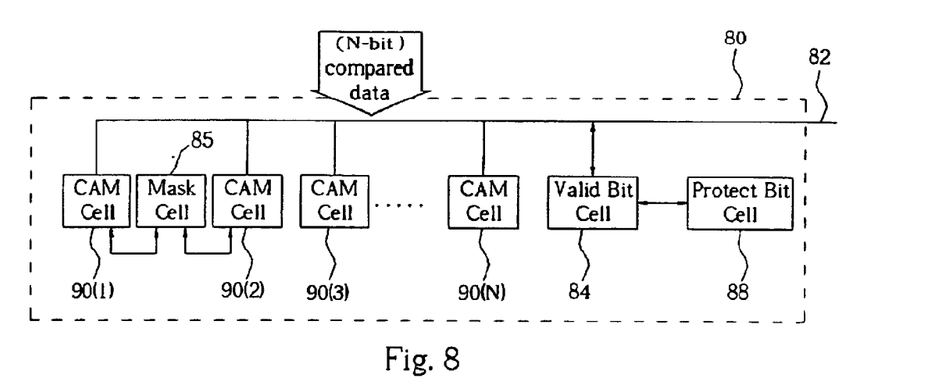
FIG. 8 is a schematic diagram of the second embodiment of an integrated CAM row according to the present invention.
Figure 9:
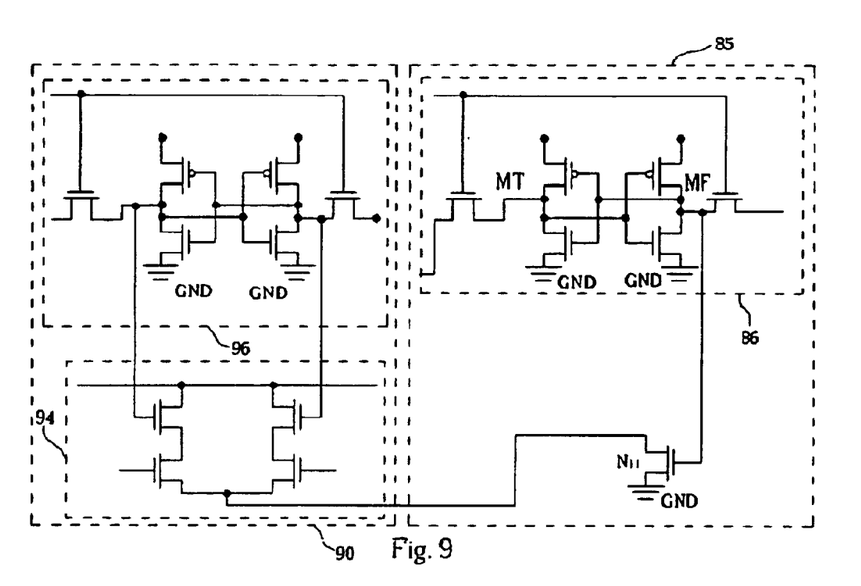
FIG. 9 is a schematic diagram of an embodiment of the mask cell as shown in FIG. 8 and an associated CAM cell connected to the mask cell.
Figure 10:
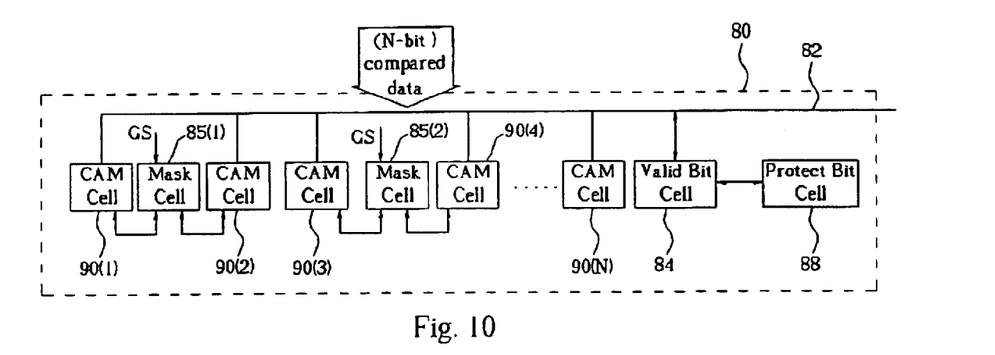
FIG. 10 is a schematic diagram of the third embodiment of an integrated CAM row according to the present invention.

Please refer to FIG. 8, which is a schematic diagram of the second embodiment of an integrated CAM row 80 according to the present invention. The major difference between the present embodiment and the former embodiment shown in FIG. 5 is the installation of a mask cell 85. The integrated CAM row 80 includes a match line 82 for providing a corresponding match signal, a plurality of (N) CAM cells 90 (90(1) to 90 (N)), a valid bit cell 84, a protect bit cell 88, and a mask cell 85 coupled to a few CAM cells for masking out those associated CAM cells when the mask cell 85 is asserted and for not masking out those associated CAM cells when the mask cell 85 is de-asserted. Two CAM cells 90(1) and 90(2) are coupled to the mask cell 85 in the present embodiment. However, the quantity of associated CAM cells connected to the mask cell 85 should not be constrained. Those associated CAM cells 90(1) and 90(2) in the present embodiment become mask-able CAM cells and effectively store three states of information, namely: a logic one state, a logic zero state, and a don't care state for comparing operations. Please refer to FIG. 9, which shows an embodiment of the mask cell 85 as shown in FIG. 8 and an associated CAM cell 90 (90(1) or 90(2)) connected to the mask cell 85. The mask cell 85 is composed of a 6-T SRAM cell 86 combined with an NMOS-type transistor N11 coupled to a 4-T comparator module 94 of the associated CAM cell 90, while the associated CAM cell 90 is a 10-T CAM cell of the present invention (as shown in FIG. 3) composed of a 6-T SRAM cell 96 and the 4-T comparator module 94. When the mask cell 85 is loaded with a logic "1" (namely, the mask cell 85 is asserted, a stored bit at a node MT is logic "1", and a stored bit at a node MF is logic "0"), the NMOS-type transistor N11 is turned off. The match line 82 of the associated CAM cell 90 (mask-able CAM cell) is always at a predetermined high potential. That is so-called don't care state for the comparing operation, and the associated CAM cell 90 is always masked out. When the mask cell 85 is loaded with logic "0" (namely, the mask cell 8S is de-asserted, the stored bit at a node MT is logic "0", and the stored bit at a node MF is logic "1"), the NMOS-type transistor N11 behaves as a virtual ground. Normal CAM-related functions of the associated CAM cell 90 as shown in FIG. 8 and FIG. 9 can be implemented. It is emphasized again that the quantity of the mask cell 85 and the quantity of the associated CAM cells 90 (connected to the mask cell 85) should not be limited. Please refer to FIG. 10, which is a schematic diagram of the third embodiment of an integrated CAM row 80, which inherits the characteristics of the embodiment as shown in FIG. 8. The quantity of the mask cells 85 is set as 2 in the present embodiment. Therefore the integrated CAM row 80 comprises 2 mask cells 85(1) and 85(2), and each mask cell 85 is coupled to 2 CAM cells for masking out those 2 CAM cells (The mask cells 85(1) is coupled to 2 CAM cells 90(1) and 90(2), while the mask cells 85(2) is coupled to 2 CAM cells 90(3) and 90(4)). Moreover, these 2 mask cells 85(1) and 85(2) can be globally de-asserted by a global signal GS. In preliminary summary, regarding those embodiments as shown in FIG. 5 to FIG. 10, the combination of a valid bit cell, a protect bit cell, and at least a mask cell in an integrated CAM row can improve and expand the security and flexibility during comparing operations.

Figure 11:
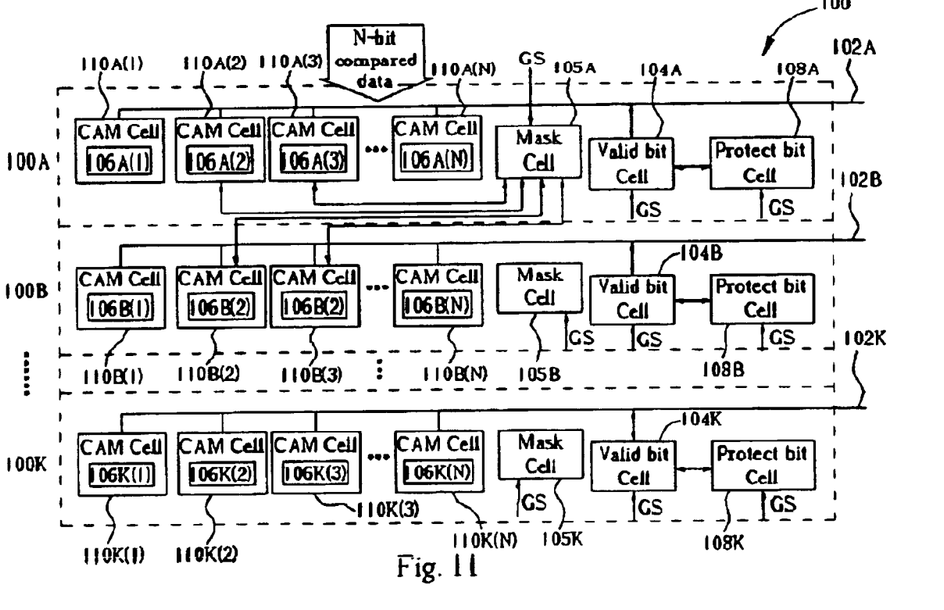
FIG. 11 is a schematic diagram of an embodiment of an integrated CAM architecture according to the present invention.

The following embodiment describes a novel integrated CAM architecture 100, which inherits the characteristics of the above-mentioned embodiments as shown in FIG. 4 to FIG. 10, based on a plurality of novel ten-transistor (10-T) CAM cells combined with a valid bit cell, a protect bit cell, and at least a mask cell coupled to a plurality of associated 10-T CAM cells in each row. Please refer to FIG. 11, which is a schematic diagram of an integrated CAM architecture 100 according to the present invention. The integrated CAM architecture 100 comprises a plurality of rows 100A to 100K and a plurality of match lines 102 (102A to 102K) corresponding to the plurality of rows 100A to 100K for providing a plurality of corresponding match signals. Each row, which is coupled to a corresponding match line 102, includes a plurality of ten-transistor (10-T) CAM cells 110 described in FIG. 4 coupled to the corresponding match line 102, a valid bit cell 104 (104A to 104K), a protect bit cell 108 (108A to 108K), and at least a mask cell 105 (105A to 105K). Please notice that, taking row 100A as example, the mask cell 105A is coupled to two associated 10-T CAM cells 1110A(2) and 110A(3) in the row 100A for masking out the associated 10-T CAM cells 1110A(2) and 1110A(3) when the mask cell 105A is asserted. In addition, the mask cell 105A of the row 100A can be connected to a plurality of associated 10-T CAM cells in the other rows (as the 10-T CAM cells 110B(2) and 110B(3) shown in FIG. 11). The valid bit cell 104 (104A to 104K) of each row is for storing a valid bit indicating whether data stored in the row of the integrated CAM architecture 100 is valid, wherein the data stored in the row of the integrated CAM architecture 100 are composed of the digital data values stored in the 6-T SRAM cells 106 of the 10-T CAM cells 110. In each row of the integrated CAM architecture 100, the protect bit cell 108 (1101A to 108K) is coupled to the valid bit cell 104 (104A to 104K) for setting the valid bit to zero when the protect bit cell 108 (108A to 108K) is de-asserted, and for setting the valid bit intact when the protect bit cell 108 (108A to 108K) is asserted. Finally, please notice that in the integrated CAM architecture 100 of the present invention, the plurality of mask cells 105 (105A to 105K), the plurality of valid bit cells 104 (104A to 104K), and the plurality of protect bit cells 108 (108A to 108K) can be globally reset by a plurality of global signals GS.

According to the present invention, a novel ten-transistor (10-T) content addressable memory (CAM) cell and an integrated CAM architecture are proposed. The novel 10-T CAM cell of the present invention can prevent the disturbance and charge sharing at a match line and provide low bit-line loading to improve high-speed and low-power performance. In addition, we provide valid bit cells, protect bit cells, and mask cells with global resetting functions in the integrated CAM architecture to sufficiently improve the correction and flexibility during comparing operations.

Those skilled in the art will readily observe that numerous modifications and alterations of the device and method may be made while retaining the teachings of the invention. Accordingly, the above disclosure should be construed as limited only by the meets and bounds of the appended claims.

What is claimed is:

1. A ten-transistor (10-T) content addressable memory (CAM) cell comprising:
   a word line;
   a first pair of complementary bit lines comprising a first bit line; and a second bit line;
   a six-transistor (6-T) static random access memory (SRAM) cell coupled to the word line, the first bit line, and the second bit line for storing a digital data value;
   a match line for providing a match signal;
   a second pair of complementary bit lines comprising a third bit line and a fourth bit line; and
   a four-transistor (4-T) comparator module coupled to the match line, the third bit line, the fourth bit line, and the 6-T SRAM cell for comparing the digital data value stored in the 6-T SRAM cell with an input data value provided on the third bit line or the fourth bit line.

2. The 10-T CAM cell of claim 1, wherein when the input data value is the same as the digital data value stored in the 6-T SRAM cell, the match signal stays at a predetermined high potential; when the input data value is opposite to the digital data value stored in the 6-T SRAM cell, the match signal changes to a low potential.

3. The 10-T CAM cell of claim 2 further comprising a pre-charge circuit coupled to the match line for pre-charging the match signal of the match line to the predetermined high potential before the comparison between the input data value and the digital data value stored in the 6-T SRAM cell.

4. The 10-T CAM cell of claim 1, wherein the 4-T comparator module is an exclusive NOR circuit, which comprises a first and a second pairs of transistors, wherein each pair of transistors is coupled between the match line and a ground terminal.

5. The 10-T CAM cell of claim 1, further comprising a mask cell coupled to the 4-T comparator module, wherein when the mask cell is asserted, the match signal stays at a high potential and the 10-T CAM is masked out.

6. An integrated content addressable memory (CAM) comprising:
   a plurality of match lines for providing a plurality of corresponding match signals; and
   a plurality of rows, each row coupled to a corresponding match line comprising:
   a plurality of CAM cells coupled to the match line;
   a valid bit cell for storing a valid bit indicating whether the row of the integrated CAM contains valid data; and
   a protect bit cell coupled to the valid bit cell for setting the valid bit to zero when the protect bit cell is de-asserted, and for setting the valid bit intact when the protect bit cell is asserted.

7. The integrated CAM of claim 6, wherein in each row of the integrated CAM, when the valid bit is zero, the row is indicated to contain invalid data; when the valid bit is one, the row is indicated to contain valid data.

8. The integrated CAM of claim 7, wherein in each row of the integrated CAM, when the valid bit is one, a comparing operation between compared data and data stored in the row of the integrated CAM is allowed to proceed.

9. The integrated CAM of claim 8, wherein in each row of the integrated CAM, when the compared data are the same as the data stored in the row of the integrated CAM, the corresponding match signal stays at a predetermined high potential.

10. The integrated CAM of claim 8, wherein in each row of the integrated CAM, when any data bit of the compared data is opposite to a corresponding data bit of the data stored in the row of the integrated CAM, the corresponding match signal changes to a low potential from the predetermined high level.

11. The integrated CAM of claim 8, wherein in each row of the integrated CAM, each CAM cell comprises a six-transistor (6-T) static random access memory (SRAM) cell and a four-transistor (4-T) comparator module.

12. The integrated CAM of claim 11, wherein in each row of the integrated CAM, each data bit of the data stored in the row of the integrated CAM is stored in each of the 6-T SRAM cells.

13. The integrated CAM of claim 11, wherein the comparing operation in each row of the integrated CAM is executed by utilizing the 4-T comparator modules.

14. The integrated CAM of claim 6, wherein in each row of the integrated CAM, the protect cell can be de-asserted by a global signal.

15. The integrated CAM of claim 14, wherein in each tow of the integrated CAM, the valid bit of the valid cell can be reset to zero by the global signal when the associated protect cell is de-asserted, and the valid bit of the valid cell will keep intact after a global reset process when the associated protect cell is asserted.

16. The integrated CAM of claim 6, wherein each row of the integrated CAM further comprises at least a mask cell coupled to a plurality of selected CAM cells for masking out the plurality of selected CAM cells when the mask cell is asserted and for not masking out the plurality of selected CAM cells when the mask cell is de-asserted.

17. The integrated CAM of claim 16, wherein in each row of the integrated CAM, the mask cell can be de-asserted by a global signal.

18. An integrated content addressable memory (CAM) architecture comprising:
   a plurality of match lines for providing a plurality of corresponding match signals; and
   a plurality of rows, each row coupled to a corresponding match line comprising:
   a plurality of ten-transistor (10-T) CAM cells coupled to the corresponding match line, each 10-T CAM cell comprising:
   a word line;
   a first bit line;
   a second bit line, wherein the first bit line and the second bit line are a pair of complementary bit lines;
   a six-transistor (6-T) static random access memory (SRAM) cell coupled to the word line, the first bit line, and the second bit line for storing a digital data value;

a first input line;

a second input line, wherein the first input line and the second input line are a pair of complementary input lines; and a four-transistor (4-T) comparator module coupled to the match line, the first input line, the second input line, and the 6-T SRAM cell for comparing the digital data value stored in the 6-T SRAM cell with an input data value provided on the first input line or the second input line;

a valid bit cell for storing a valid bit indicating whether data stored in the row of the integrated CAM architecture is valid, wherein the data stored in the row of the integrated CAM architecture are composed of the digital data values stored in the 6-T SRAM cells;

a protect bit cell coupled to the valid bit cell for setting the valid bit to zero after a global valid bit reset process if the protect bit cell is de-asserted, and for setting the valid bit intact after the global valid bit reset process if the protect bit cell is asserted; and at least a mask cell coupled to a plurality of selected 10-T CAM cells for masking out the selected 10-T CAM cells when the mask cell is asserted and for not masking out the selected 10-T CAM cells when the mask cell is de-asserted.

19. The integrated CAM architecture of claim 18, wherein in each row of the integrated CAM architecture, when the valid bit is zero, the data stored in the row of the integrated CAM architecture are invalid; when the valid bit is one, the data stored in the row of the integrated CAM architecture are valid.

20. The integrated CAM architecture of claim 19, wherein in each row of the integrated CAM architecture, when the valid bit is one, a comparing operation, which is executed by utilizing the 4-T comparator modules, between compared data and the data stored in the row of the integrated CAM architecture is allowed to proceed.

21. The integrated CAM architecture of claim 20, wherein the compared data are composed of the input data values provided on the first input lines or the second input lines.

22. The integrated CAM architecture of claim 20, wherein in each row of the integrated CAM architecture, when the compared data are the same as the data stored in the row of the integrated CAM architecture, the corresponding match signal stays at a predetermined high potential; when any data bit of the compared data is opposite to a corresponding data bit of the data stored in the row of the integrated CAM architecture, the corresponding match signal changes to a predetermined low potential.

23. The integrated CAM architecture of claim 18, wherein each row of the integrated CAM architecture further comprises a plurality of mask cells, each coupled to a plurality of selected CAM cells for masking out the plurality of selected CAM cells of the same row when the mask cell is asserted and for not masking out the plurality of selected CAM cells when the mask cell is de-asserted.

24. The integrated CAM architecture of claim 23, wherein in each row of the integrated CAM architecture, the plurality of mask cells can be globally de-asserted by a global signal.

* * * * *